United States Patent [19]

Britt

[11] Patent Number: 5,488,859
[45] Date of Patent: Feb. 6, 1996

[54] VEHICLE TESTING DEVICE AND METHOD

[75] Inventor: John C. Britt, High Point, N.C.

[73] Assignee: Bal-Jetta Systems Company, Inc., High Point, N.C.

[21] Appl. No.: 358,391

[22] Filed: Dec. 19, 1994

Related U.S. Application Data

[63] Continuation-in-part of Ser. No. 280,127, Jul. 25, 1994, Pat. No. 5,406,837.

[51] Int. Cl.$^6$ ........................................................ G01L 1/02
[52] U.S. Cl. .............................................. 73/121; 73/129
[58] Field of Search .............................. 73/121, 129, 132

[56] References Cited

U.S. PATENT DOCUMENTS

| | | | |
|---|---|---|---|
| 3,824,847 | 7/1974 | Chambers | 73/132 |
| 4,050,298 | 9/1977 | Hope et al. | 73/121 |
| 4,062,224 | 12/1977 | Zelney | 73/121 |
| 4,586,370 | 5/1986 | Massender | 73/121 |
| 4,771,387 | 9/1988 | Hexel et al. | 73/121 |
| 4,935,047 | 6/1990 | Wu | 70/209 |

OTHER PUBLICATIONS

Bendix System Trouble Shooting Chart (1993).
Anchorlok S–Cam Service and Parking/Emergency Brake Brochure (undated).

Primary Examiner—Hezron E. Williams
Assistant Examiner—Max Noori

[57] ABSTRACT

A vehicle testing device and method are provided whereby a mechanic can easily test the pneumatic brake systems of a tractor-trailer. The device is used by inputting into the device the electrical and pneumatic outputs of a tractor and by outputting electrical and pneumatic transmissions from the device into a trailer. The device accepts input from a tractor and produces output to a trailer for testing purposes. The testing device is compact and portable and affords a mechanic a convenient tool for efficiently carrying out the necessary safety tests on both the tractor and trailer which may be physically connected or disconnected at the time the testing occurs.

19 Claims, 6 Drawing Sheets

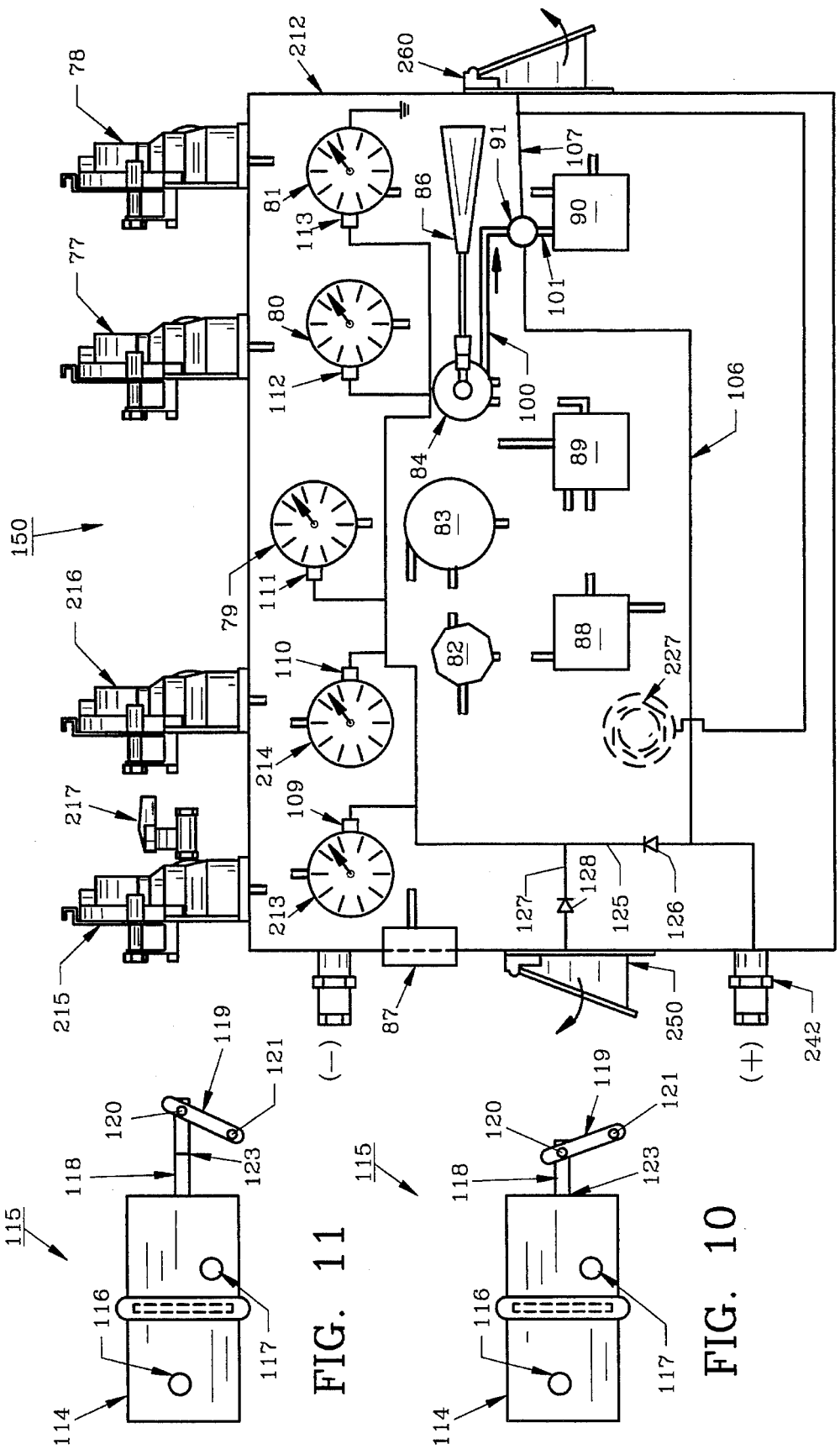

5,488,859

VEHICLE TESTING DEVICE AND METHOD

This is a continuation-in-part of application Ser. No. 08/280127 filed 25 Jul. 1994 U.S. Pat. No. 5,406,837, for VEHICLE TESTING DEVICE AND METHOD.

BACKGROUND OF THE INVENTION

1. Field of the Invention

The invention herein pertains to a device and method for testing the vehicle safety systems of tractor-trailers and other vehicles as used in commercial hauling and private use. The device and method allow for the testing of the electrical safety lights, the pneumatic brake systems, and related pneumatic elements. The testing equipment herein is useful for trucking companies, D.O.T. officials, and others that must periodically inspect the brake and electrical light systems of tractor-trailers for compliance with the Federal Motor Carrier Safety Regulations.

2. Description of the Prior Art and Objectives of the Invention

Safety is a primary concern of the U.S. Department of Transportation (D.O.T.), trucking companies and all personnel associated therewith. Tractor-trailers are responsible for transporting most of the goods in the United States and other countries and the pneumatic braking systems which are employed must be frequently tested along with the turn signals, brake lights, auxiliary lighting, clearance lighting, and tail lights to insure a safe vehicle. Over the years mechanics have developed various systems to correctly and efficiently test and repair the pneumatic and electrical light circuits of tractor-trailers but many of the test procedures require two men. As such, the cost of frequent inspections for tractor-trailers has greatly increased in some cases, therefore putting the drivers, other motorist and property at risk as fewer inspections and tests are undertaken. Heretofore a single mechanic would have difficulty in checking, for example, the pneumatic and hydraulic brake system beneath the tractor-trailer or other vehicles while holding the brake pedal depressed and would likewise have difficulty in observing the brake lights at the rear of the tractor-trailer, car, truck, or bus from a position inside the cab of the vehicle. In addition, it has been difficult in the past to check the electrical light circuits of a trailer if unattached from a tractor because power must be supplied to the trailer electrical circuitry for a visual inspection. Like wise it has been very difficult to check the pneumatic brake system of a trailer if the trailer is not attached to a tractor because the trailer does not have the ability to generate and control compressed air for the pneumatic system. Likewise it has been difficult to isolate the source of electrical and pneumatic problems as being in the tractor, the trailer, or the tractor-trailer.

For this and other reasons the present invention was conceived and one of its objectives is to provide a method and testing apparatus for a tractor-trailer which will allow a sole mechanic to check the safety systems of tractor-trailers and other vehicles with accuracy.

It is another objective of the present invention to provide a means for a single mechanic to check the electrical light circuitry and pneumatic brake system of a tractor and a trailer with accuracy either when the tractor and trailer are physically connected and parked together or are disconnected and parked at separate locations.

It is also an objective of the present invention to provide a method for testing the pneumatic system as well as the electrical light system of tractor-trailers by a single mechanic with improved efficiency, convenience and accuracy by providing a single apparatus which can receive input from a tractor and transmit output to a trailer when the tractor and trailer are mechanically connected but electrically and pneumatically disconnected.

It is yet another objective of the present invention to provide a device to maintain a brake pedal in a depressed posture to allow the mechanic to leave the tractor cab and visually inspect beneath the tractor-trailer for air leaks, frayed or damaged air lines and components while the brake pedal remains depressed.

It is also an objective of the present invention to provide a device to maintain a clutch pedal or accelerator pedal in a depressed posture to allow a mechanic to work on the vehicle.

It is still another objective of the present invention to provide a testing device whereby the outside electrical lights and pneumatic brake systems are quickly and easily checked to determine if any defects exist or if repairs are necessary.

It is yet another objective of the present invention to provide a device and method whereby the time spent on inspecting trailers and tractors is reduced by allowing the trailers and tractors to be tested and inspected separately thereby saving the time spent moving and connecting the separated tractors and trailers.

It is yet still another objective of the present invention to provide a device for testing electrical light circuitry and pneumatic brake systems of tractor-trailers which includes a compact, easily portable housing containing electrical circuitry with pneumatic fittings and easily visible gauges and lights thereon.

It is a further objective of the present invention to provide a testing device and method for tractor-trailers which includes a metal housing having a pair of battery connections for testing certain electrical circuitry of trailers while disconnected from the electrical supply of the tractor by applying proper voltage to the battery connections with accuracy.

It is still another objective of the present invention to provide a device and method for testing tractor and trailers which includes an air compressor junction that allows for the device to be connected to a portable air compressor or other source of compressed air.

Various other objectives and advantages of the present invention will become apparent to those skilled in the art as a more detailed description is set forth below.

SUMMARY OF THE INVENTION

The aforesaid and other objectives are realized by providing a device and method for quickly testing certain electrical light output circuits of a tractor and electrical input circuits of a trailer by a sole mechanic. The conventional electrical pigtail from the tractor can be connected to the test device and the brake light, auxiliary light, clearance light, ground, tail light and both turn signal circuits of the tractor can be checked by turning on the various tractor dashboard switches, while observing the visual indicators of the device. With the trailer electrically disconnected from the tractor, the testing device can also be used to check the same light circuitry of the trailer by applying battery power to the device through convenient battery connections thereon. Switches on the housing of the test device act as substitute switches for the tractor switches for the various light circuits and allow for the mechanic to energize these safety light circuits while observing the safety lights of the trailer. The testing device is lightweight and easily portable and can be carried from vehicle to vehicle with relatively ease with accurate test capability.

In addition to testing the electrical light circuitry as mentioned above, the pneumatic brake and air suspension systems can likewise be tested. The device includes a pair of pneumatic inlets and connected gauges for respectively observing the pneumatic output pressure of the tractor brake systems when the tractor is pneumatically disconnected from the trailer. Both the service and emergency pneumatic systems of the tractor and its pneumatic outputs can be checked and thereafter appropriate repairs made as required. The emergency inlet on the testing device includes a check valve to release air pressure to simulate a ruptured air line for checking the tractor protection valve. The tractor pneumatic brake system can be tested by connecting the tractor glad hands (connections) to the testing device. Also, trailers of the tandem (double) type when pneumatically connected to the tractor can be checked as they provide available rear glad hand connectors for coupling to the trailing trailer. The trailing trailer electrical lighting system can also be checked.

In order to check the brake system the brake pedal must be depressed and the testing device therefore can be used in combination with an adjustable, elongated device as hereinafter more fully described which can be positioned between the brake pedal and the tractor seat or other rigid structure within the cab. This device allows the mechanic to depress the brake pedal, exit the tractor cab and move beneath the tractor and/or trailer while the pedal remains depressed to visually and audibly inspect the brake lines, fittings and components and for proper brake adjustment.

In addition to testing the electrical light circuitry outputs and pneumatic systems outputs of a tractor as mentioned above, the pneumatic safety systems of the trailer can likewise be tested. In addition to accepting pneumatic and electrical inputs from a tractor, the device is able to provide pneumatic and electrical outputs to a trailer for testing purposes. The device includes an air compressor junction designed to accept an appropriate connection from a compressed air supply, preferrably portable, such as a compressor mounted on a service truck. The device also includes two pneumatic outlets to which the emergency and service pneumatic input lines of a trailer to be tested are connected. With this device and method compressed air entering the air compressor junction is regulated, adjusted, and controlled by the device so as to provide controlled pneumatic outputs to test the pneumatic safety systems of trailers which may be connected to the device outlets. The device then may be further utilized in a method of measuring the travel of a push rod of an air brake chamber of a trailer wherein the withdrawn push rod is marked, then the push rod is extended by use of the device and the subsequent travel of the push rod is measured.

The device can be utilized in this manner to isolate pneumatic and electrical problems of a tractor-trailer by inserting the device between the pneumatic and electrical systems of the tractor and the pneumatic and electrical systems of the trailer. The device is particularly useful in that an electrical or pneumatic problem of a tractor-trailer can be effeciently diagnosed by using the device to provide both a means to test the output from the tractor and also provide a test output to the trailer. By using the device on a tractor-trailer that is physically attached together, but pneumatically and electrically disconnected, a mechanic can receive input from a tractor and supply output to a trailer in order to isolate the source of the problem to either being in the trailer systems, the tractor systems, or the combined tractor-trailer systems when connected.

BRIEF DESCRIPTION OF THE DRAWINGS

FIG. 9 demonstrates additional electrical circuitry incorporated into the second embodiment with pneumatic hoses cut off for clarity;

FIG. 10 shows a side elevational view of an air brake chamber with the push rod withdrawn;

FIG. 11 illustrates a side elevational view of an air brake chamber with the push rod extended therefrom.

DETAILED DESCRIPTION OF THE PREFERRED EMBODIMENTS AND OPERATION OF THE INVENTION

Figure 1:
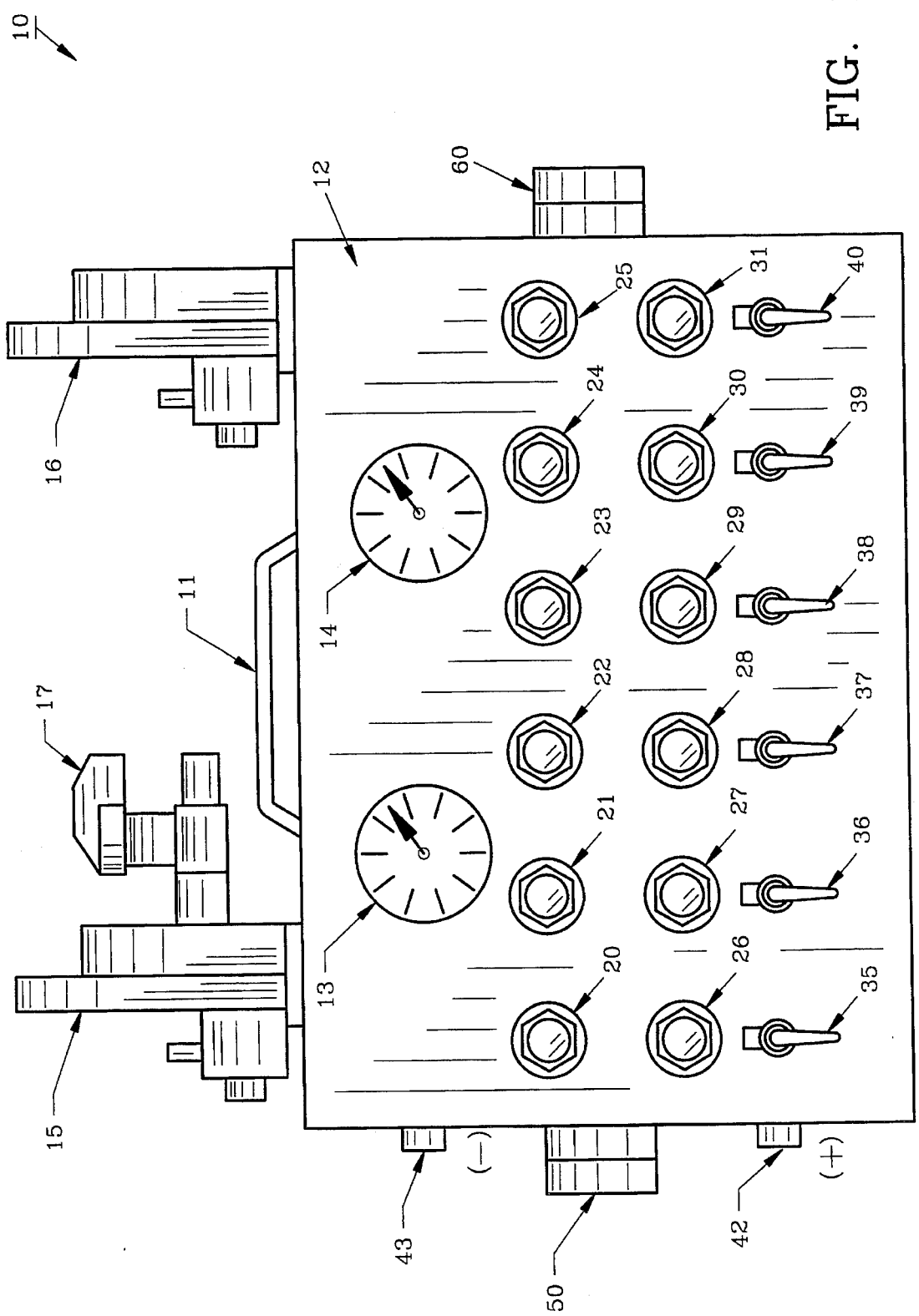
FIG. 1 shows a front elevational view of the first embodiment of the vehicle testing device of the invention without tractor-trailer pneumatic and electrical lines connected thereto.

For a detailed description of the invention and its method of operation, turning now to the drawings, FIG. 1 shows a frontal view of the housing of the first embodiment of vehicle testing device 10 as would be used to check certain electrical light circuits of a conventional tractor-trailer (not shown). Device 10 is also used to check the pneumatic brake systems of the tractor and tandem trailers and as seen, includes handle 11 for convenience in carrying by a mechanic. Handle 11 is affixed to housing 12 which may consist of a rectangular box formed of thin sheet metal or other suitable materials. Housing 12 contains pneumatic pressure gauge 13 for connection to the "emergency" tractor or trailer pneumatic output line and pressure gauge 14 is connected to the service or "application" brake output lines as will be hereinafter more fully described. Gauge 13 is in fluid communication with emergency glad hand inlet 15 whereas gauge 14 is in fluid communication with service glad hand inlet 16 shown atop housing 12 in FIG. 1. Inlets 15 and 16 are conventional connections for coupling to the pneumatic output lines from the tractor and/or tandem trailer as required. Glad hand inlet 15 has manually operated check valve 17 which can be used to emulate a ruptured pneumatic line during testing to check the tractor protection valve. Testing device 10 can be connected for pneumatic and electrical testing to tractors and/or trailers of the "tandem" type which have rear pneumatic couplings and electrical connections, provided the tandem trailer is pneumatically and electrically joined to the tractor for an accurate test of both the braking system and lighting. Converter dollies are used between tandem type trailers and likewise can be tested pneumatically and electrically.

Figure 2:
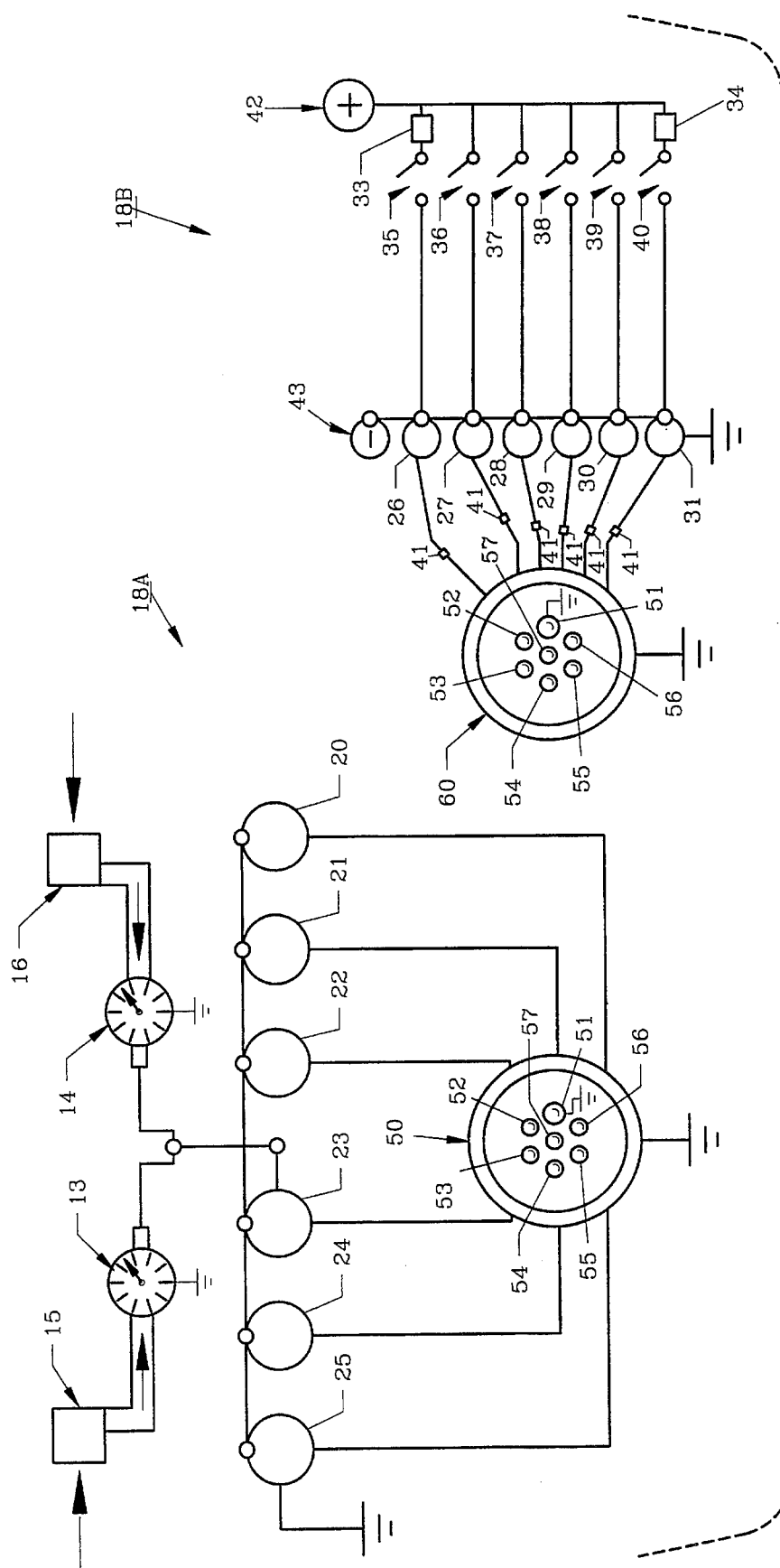
FIG. 2 illustrates the electrical and pneumatic circuitry of the first embodiment of the testing device.

Housing lights 20–31 are substantially low voltage lights although LED's or the like may also be used. As shown in FIG. 2, lights 26 and 31 having flashing circuitry 33, 34 respectively connected thereto as will be hereinafter more fully explained. Switches 35–40 are connected respectively to lights 26–31 as also seen in FIG. 2. In FIG. 1, power can be applied to circuitry 18B of FIG. 2 by connecting a standard 12 volt storage battery to negative pole 43 and positive pole 42. Negative pole 43 and positive pole 42 are used to power the device while checking the light circuitry of a trailer when it has been electrically disconnected from the tractor.

In use for checking tractor wiring and switches, the electrical tractor pigtail output line (not shown) is inserted into electrical inlet connection 50, which as shown in FIG. 2 (circuitry 18A), includes seven probes, specifically ground probe 51, left turn signal probe 55, brake light probe 54, auxiliary light probe 57, clearance light probe 56, tail light probe 52 and right turn signal light probe 53 which engages mating circuits of the tractor pigtail output line. With the electrical pigtail output line from the tractor connected to the test device and the turn signal, brake light, auxiliary light, clearance light, ground and tail light output circuits of the tractor can be checked by turning on the various tractor dashboard switches, while observing the visual indicators of the device.

With the electrical light circuitry of a trailer separated (electrically disconnected from the tractor) to check, 12 volt battery power is applied to positive pole 42 and negative pole 43 on testing device 10. As seen in FIG. 2, circuit 18B the trailer pigtail input line (not shown) is inserted into electrical outlet 60 and switches 35–40 can thus be manually activated with the pigtail input line from the trailer joined to electrical outlet 60. Outlet 60 is equipped with circuit breakers 41. Switches 35–40 are turned on to simulate the appropriate tractor cab switches for example, left and right turn signals, brake lights, auxiliary lights, clearance lights and tail lights of the trailer. With switches 35–40 turned on, a mechanic can easily verify whether or not the respective lights on the trailer are on and operational, if not, make appropriate replacements or repairs. As would be understood, flasher circuits 33 and 34 allow the left and right turn signal light to flash as would occur under normal operating conditions.

Figure 5:
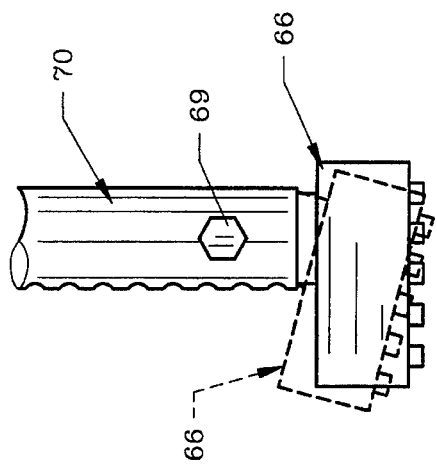
FIG. 5 shows a fragmented view of one elongated device support to demonstrate the pivotal action provided.
Figure 3:
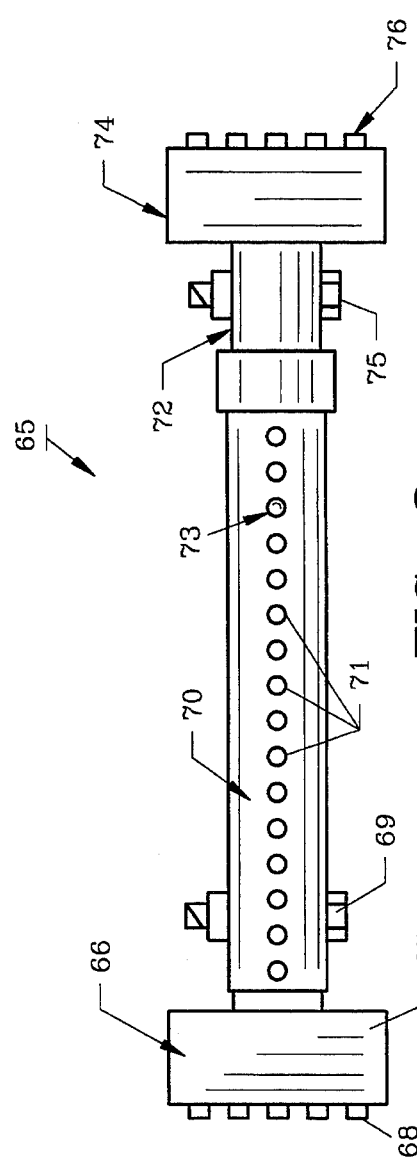
FIG. 3 demonstrates an elongated device of the invention for depressing a vehicle pedal during testing.
Figure 4:
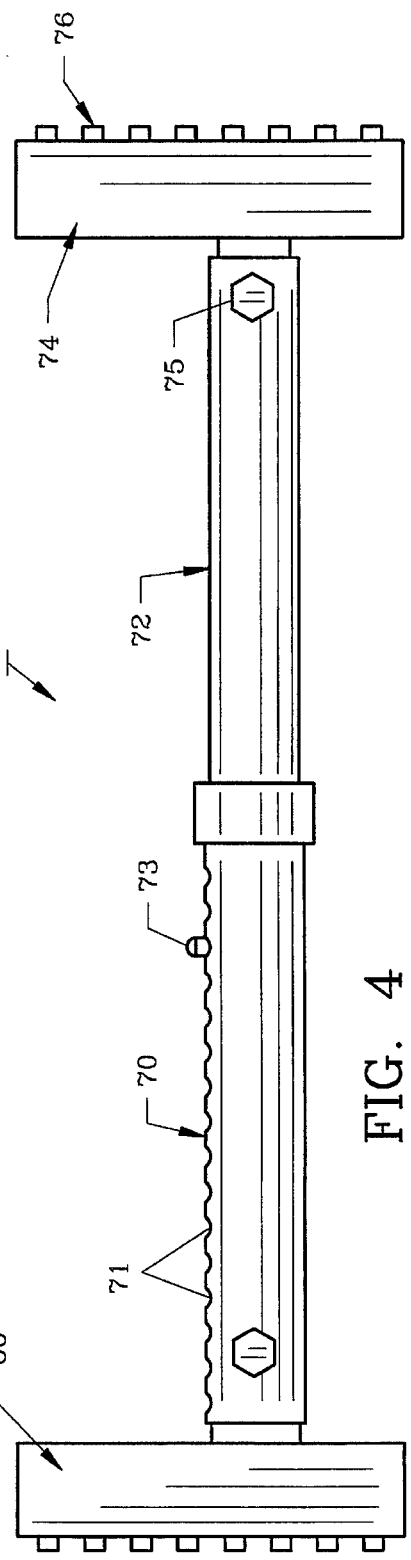
FIG. 4 shows an extended side view of the device as shown in FIG. 3.

When checking the brake pneumatic system and brake lights, especially when a mechanic is working alone, adjustable, elongated device 65 as shown in FIGS. 3, 4 and 5 can be of great assistance. As seen, device 65 includes a first support 66 which consists of a pad 67 having a rubber tread 68 affixed thereto for friction producing purposes. Support 66 is rectangular in shape and will pivot as shown in FIG. 5 around threaded member 69. Support 66 is positioned within first, large tubular member 70 which defines a series of apertures 71 therealong for adjustment purposes. Smaller diameter second tubular member 72 telescopingly fits within first tubular member 70. First tubular member 70 may for example have an outside diameter of one inch (2.54 cm) and second tubular member 72 may have an outside diameter of three-quarters of an inch (19.05 cm). As shown in FIG. 4, second tubular member 72 is extended from first tubular member 70 and lock pin 73 which is spring-loaded on second tubular member 72 extends through one of apertures 71 on first tubular member 70 to hold the second tubular member 70 fixed relative thereto. Second rectangular support 74 is likewise pivotally mounted by threaded member 75 to second tubular member 72. Second support 74 likewise includes a rubber tread 76 affixed thereto. In operation, the mechanic can place first support 66 against the brake pedal, extend second tubular member 72 a desired distance, and then frictionally engage second support 74 against the driver's seat or some other fixed object in the tractor cab. The pivoting action of first support 66 as shown in FIG. 5 provides convenience in adjusting and placing elongated device 65 during operation. With the brake pedal so depressed, the hydraulic brake system or air brake system can be inspected and checked, brake lights checked and adjustments made without the need for a second mechanic to assist the first mechanic or D.O.T. offical.

Elongated device 65 can also be used by a sole mechanic to inspect the brake system and brake lights of a school bus. Elongated device 65 can be further utilized by a sole mechanic to apply brake pedal pressure while bleeding a motor vehicles hydraulic brake system.

In order to check the pneumatic brake system of a tractor or a trailer of the tandem type (multi-trailer type), testing device 10 can be of great assistance. As would be understood, a conventional tractor includes (1) a manual (red) emergency valve button (park brake) on the cab dash for the trailer, (2) a manual (yellow) valve button (park brake) on the cab dash for the tractor which is pneumatically connected to the red emergency valve, (3) a hand brake valve contiguous to the tractor cab hand brake, (4) a foot brake valve contiguous to the foot brake pedal and (5) a tractor protection valve which is normally located exteriorly of the cab, usually on the back side thereof. Conventional tractor-trailer park brakes are operated by positive spring tension whereupon the pneumatic pressure components (normally active) lessen the spring tension, thus allowing the vehicle to move. In the event pneumatic pressure is terminated, as by an air line rupture of a tractor-trailer having typical spring brake chambers, the spring tension immediately applies brakes at each wheel having such spring brake chambers. The (red) emergency valve button must be depressed for the trailer if connected to the tractor to move and the (yellow) valve button must be pressed in for the tractor to move. Colors herein mentioned are standard in the industry. The conventional hand and foot brake valves are operated by the driver during operation as necessary. Testing device 10 can thus be used to check the pneumatic system of the tractor or a tractor-trailer combination even when the trailer is of the tandem type having one, two or sometimes three trailers.

The method of testing the pneumatic system comprises joining the emergency and service output lines of for example, the tractor to respectively emergency glad hand inlet 15 and service glad hand inlet 16 on testing device 10 as shown in FIG. 1 with testing device 10 in full view of the user. With device 10 so connected, the (red) emergency dash valve button and (yellow) dash valve button in the tractor cab are then pushed in and air pressure maintained between 90 and 120 psi. Emergency air gauge 13 on testing device 10 should read approximately 120 psi. A visual and audible inspection of the tractor pneumatic lines and valves can then be made with repairs and replacements if any are found leaking, damaged or frayed. Next, the tractor foot brake is applied and application gauge 14 is viewed.

When the foot brake is fully depressed, pressure on gauge 14 should rise immediately to approximately 120 psi and when released, the pressure on gauge 14 should drop immediately. Next, check hand valve operation and for air leaks, with the (red) trailer emergency valve remaining in, the hand brake valve (not shown) is operated and service gauge 14 on testing device 10 is read. It should rise to approximately 120 psi and release instantly as the hand brake valve is released. With the hand brake "on" a complete visual and audible inspection of the pneumatic lines should again be carried out with any repairs and replacements made as before. Elongated pedal pushing device 65 as shown in FIG. 5 can then be wedged between the seat or some other stable object in the tractor cab and the brake pedal to hold the brake pedal depressed. The tractor pneumatic system should then be visually and audibly inspected and as before any damaged, frayed or leaking valves or lines repaired or replaced. Next, with the (red) emergency valve depressed and the pressure near 120 psi on gauge 13, the tractor protection valve is checked by rotating check valve 17. Upon opening check valve 17, gauge 13 should drop immediately to zero psi, air will continue to escape until the tractor protection valve closes and simultaneously the trailer red emergency valve on the dash will pop out at approximately 45 psi demonstrating that the tractor protection valve is working properly. Some tractor protection valves are designed to pop out quicker and at a higher air pressure level. The same test procedures can also be carried out on a tandem type trailer pneumatically connected to the tractor from the rear emergency air hook up as normally provided.

Figures 6, 7:
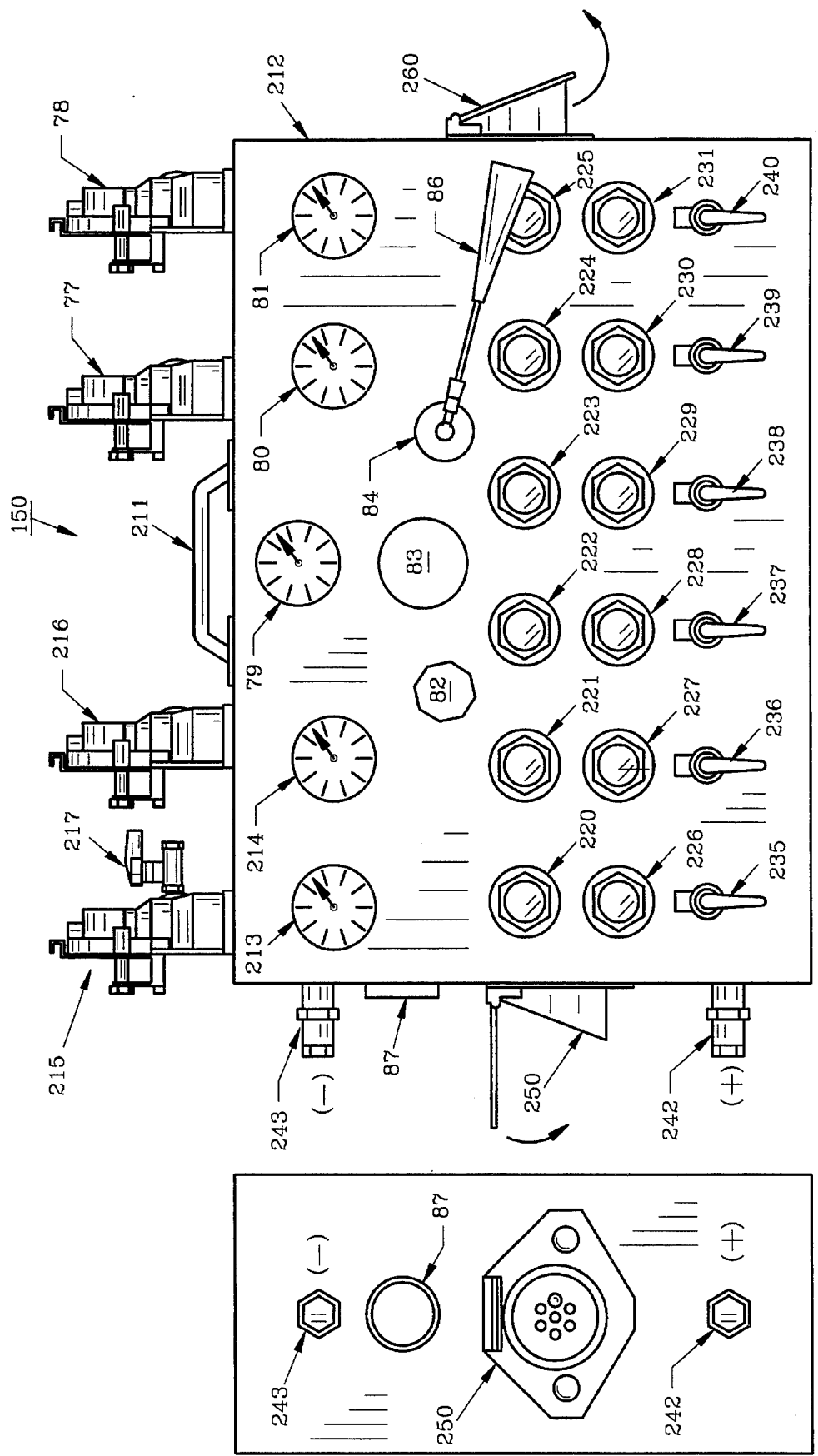
FIG. 6 shows a front elevational view of the second embodiment of the vehicle testing device of the invention without a compressed air supply, D.C. power supply, and tractor-trailer pneumatic and electrical lines connected thereto.
FIG. 7 shows a side view of the second embodiment of the vehicle testing device of the invention without a compressed air supply and D.C. power supply connected thereto.

Turning now to the second embodiment of the testing device, testing device 150 contains the electrical and pneumatic circuitry and components of testing device 10 as disclosed with additional components for testing the pneumatic safety systems of trailers which are not pneumatically connected to a tractor. FIG. 6 shows a frontal view of vehicle testing device 150 as would be used to check the electrical light circuits and the pneumatic brake systems of tractors-trailers as described above with device 10. Device 150 includes handle 211 for convenience in carrying by a mechanic. Handle 211 is affixed to housing 212 which may consist of a rectangular box formed of thin sheet metal or other suitable materials. Housing 212 contains pneumatic pressure gauge 213 for connection to the tractor's emergency pneumatic output line and pressure gauge 214 is likewise connected to the service pneumatic output line. Gauge 213 is in fluid communication with emergency glad hand pneumatic inlet 215 whereas gauge 214 is in fluid communication with service glad hand pneumatic inlet 216 shown atop housing 212 in FIG. 6, 8 and 9. Pneumatic inlets 215 and 216 are conventional connections for coupling to the pneumatic output lines from the tractor and/or tandem trailer as required. Glad hand pneumatic inlet 215 has manually operated check valve 217 which can be used to emulate a ruptured pneumatic line during testing to check the tractor protection valve. Testing device 150 can be connected and used in the same manner as device 10 for pneumatic and electrical testing of tractor-trailers.

As shown in FIG. 6 housing lights 220–231 of device 150 are the same as and have the same function as housing lights 20–31, respectively, of device 10. Switches 235–240 of device 150 are the same as and have the same function as switches 35–40, respectively, of device 10. Negative pole 243 of device 150 is the same as and has the same function as negative pole 43 of device 10. Positive pole 242 of device 150 is the same as and has the same function as positive pole 42 of device 10. Electrical inlet 250 and electrical outlet 260 of device 150 are the same as and have the same function as electrical inlet 50 and electrical outlet 60 of device 10.

Figure 8:
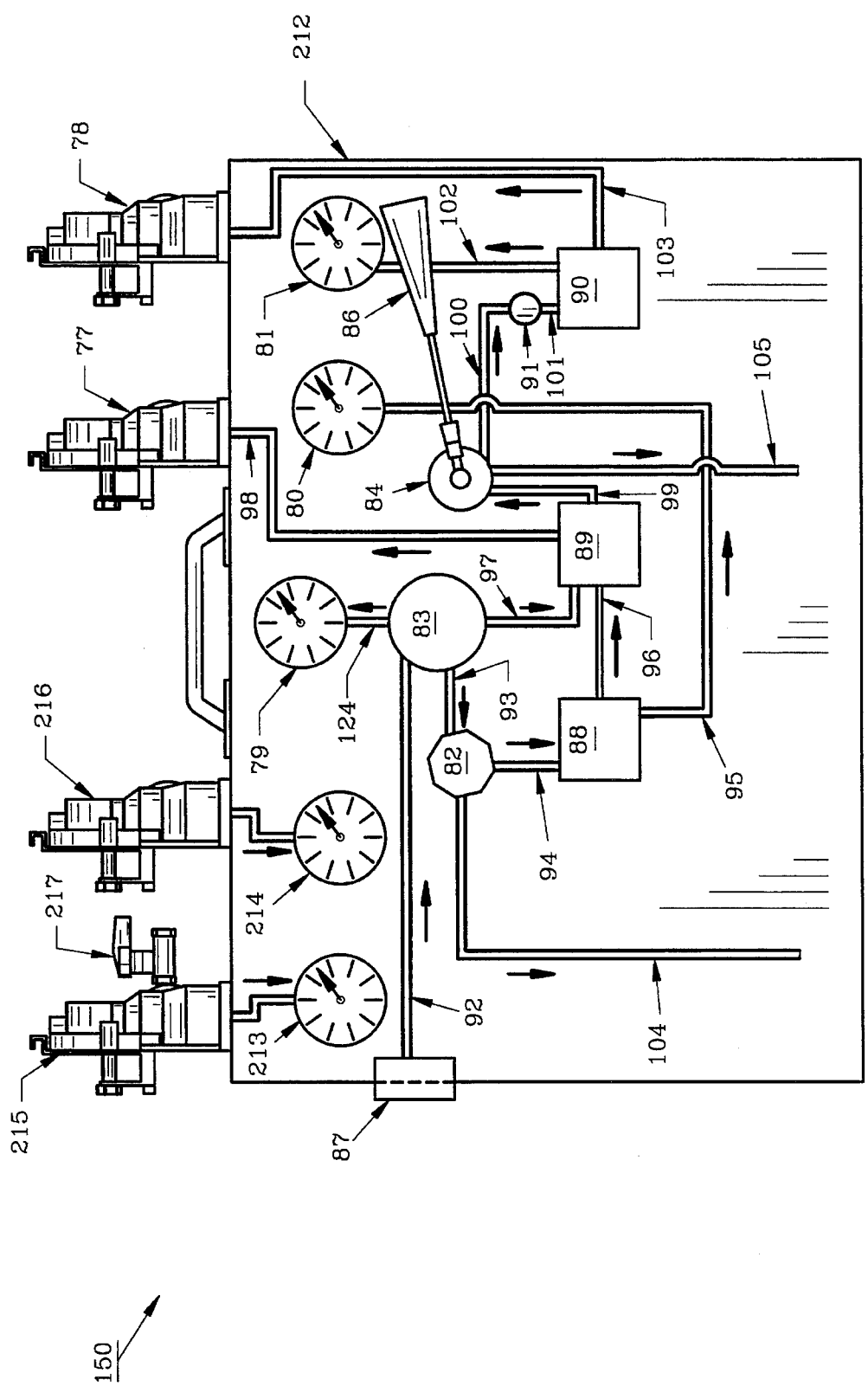
FIG. 8 illustrates the pneumatic circuitry of the second embodiment of the testing device.

In addition to testing the pneumatic systems of a tractor as described above, the pneumatic safety systems of the trailer can likewise be tested by device 150 when the trailer is not pneumatically connected to a tractor. Device 150 includes air compressor junction 87 as seen in FIG. 6–9 designed to accept an appropriate connection from a compressed air supply (not shown), preferrably portable, such as a compressor mounted on a service truck. During use the compressed air supply is kept running to provide a continuous supply of compressed air. Device 150 also includes pneumatic outlet 77 to which the emergency air line of a trailer to be tested is connected. The service air line of a trailer to be tested is connected to pneumatic outlet 78. As seen in FIG. 8 compressed air entering the devise through air compressor junction 87 travels through pneumatic hose 92 to adjustable pneumatic regulator 83. Adjustable pneumatic regulator 83 is used to regulate the supplied air pressure down to 120 psi which is indicated on pneumatic gauge 79 that is connected by hose 124 to regulator 83. Regulator 83 is connected to pneumatic switch 82 by hose 93. Compressed air entering pneumatic switch 82 will be transmitted to first pneumatic quick release valve 88 by hose 94 when switch 82 is operated. Compressed air entering first pneumatic quick release valve 88 is conveyed to pneumatic gauge 80 by hose 95. First pneumatic quick release valve 88 also conveys compressed air to pneumatic relay valve 89 by hose 96. Pneumatic relay valve 89 receives compressed air directly from regulator 83 by hose 97. Pneumatic relay valve 89 conveys the compressed air received from regulator 83 to pneumatic pivot switch 84 by hose 99 and to pneumatic outlet 77 by hose 98 as compressed air is received from hose 96. When pneumatic pivot switch 84 is operated, compressed air is conveyed through hose 100, air pressure sensor 91, and hose 101 and into second pneumatic quick release valve 90. When compressed air is transmitted through air pressure sensor 91 to second pneumatic quick release valve 90, air pressure sensor 91 closes the brake light circuit thereby sending electrical current to housing light 227 and the brake light probe 54 circuit through electrical outlet 260. Second pneumatic quick release valve 90 conveys the compressed air to pneumatic outlet 78 by hose 103. The pressure of compressed air conveyed by pneumatic quick release valve 90 is indicated on pneumatic gauge 81 which is connected to pneumatic quick release valve 90 by hose 102. Pneumatic gauges 213, 214, 79, 80, and 81 are illuminated by gauge lights 109–113 (FIG. 9) respectively which are commonly grounded together. Electrical power is supplied to lights 109–113 by either connection to positive terminal 242 with power lead 125 which includes diode 126 or connection to auxiliary light probe 57 of electrical inlet 250 with tractor power lead 127 which includes diode 128.

Compressed air entering compressor junction 87 is regulated, adjusted, and controlled by device 150 so as to test the pneumatic safety systems of trailers that are connected to outlets 77 and 78. Device 150 is readily portable and is designed so that it may be transported, along with a portable air compressor (not shown) to a remote location of a trailer to be tested. Compressed air is supplied to device 150 by connecting a hose and fitting from the portable air compressor to compressor junction 87. The compressed air entering the device through compressor junction 87 is regulated, to preferrably 120 psi which is the normal operating pressure for pneumatic safety systems, by turning regulator 83 while observing the pressure displayed on regulator gauge 79. For safety reasons the wheels of the trailer being tested should be chocked before the inputs to the service and emergency pneumatic systems of the trailer are connected to device 150. The emergency pneumatic system of the trailer is connected to outlet 77 and the service pneumatic system of the trailer is connected to outlet 78. The electrical pigtail input line (not seen) of the trailer is received by electrical outlet 260. Then regulated compressed air is supplied to the emergency pneumatic system of the trailer connected to outlet 77 for testing and inspection purposes by operating pneumatic switch 82. Then regulated compressed air is supplied to the service pneumatic system of the trailer connected to outlet 78 for testing and inspecting purposes by operating pneumatic pivot switch 84. Pneumatic pivot switch 84 is operated by rotating handle 86. The pressure of compressed air supplied to the trailer's service pneumatic system may be adjusted by pivoting handle 86 at various degrees within its range of motion as illustrated in FIG. 6, 8, and 9. The emergency pneumatic system of the trailer which includes emergency air lines, emergency brakes, air ride suspension, pneumatic lifts and jacks, are inspected and examined by the mechanic while pneumatic switch 82 is activated so that regulated compressed air is continuously supplied to the trailer's emergency pneumatic system. Pivoting handle 86 will maintain its adjusted position so that regulated compressed air is continuously outputted to the trailer's service pneumatic system to allow inspection of brake chamber lines, fittings, and hoses for leaks, missing hardware, damaged parts and adjustments.

With device 150 connected to the pneumatic safety system of the trailer as described above, a user of device 150 is enabled to make an efficient examination of air brake chamber 115 which is an important and crucial part of the pneumatic system of the trailer. Device 150 can be utilized in making a quick and accurate measurement and inspection of the travel of push rod 118 of air brake chamber 115 when it is extended from brake chamber housing 114 in a simulated application of the tractor brake pedal, in which braking force is applied to the trailer wheels by compressed air pressure reaching air brake chamber 115 through the service pneumatic system of the trailer as shown in FIGS. 10 and 11. Device 150 may be utilized in a method of measuring the travel of push rod 118 from air brake chamber housing 114 during a simulated brake pedal application. Regulated compressed air from device 150 is applied through the emergency side pneumatic system of the trailer and into air brake chamber housing 114 (FIGS. 10 and 11) through emergency air inlet 116. At this point no compressed air is applied to the service side pneumatic system of the trailer. Push rod 118 is withdrawn into air brake chamber housing 114 to the "off" position as shown in FIG. 10, then by operating switch 82 compressed air of approximatley 120 psi is conveyed through the emergency pneumatic system to air brake chamber housing 114. While this compressed air pressure is maintained the user marks a point on push rod 118 as a reference point to determine the travel of push rod 118 when subsequent air pressure is applied. The prefered point of marking withdrawn push rod 118 is the point on push rod 118 immediately adjacent to air brake chamber housing 114 designated by point 123 in FIG. 10. The preferred method of marking point 123 is by spray painting the push rod at point 123 (FIG. 10) so that a line is formed where push rod 118 enters air brake chamber 114.

After so marking reference point 123, push rod 118 is extended from air brake chamber housing 114 by pivoting pivot handle 86 to apply compressed air from outlet 78 through the service pneumatic system of the trailer and into air brake chamber housing 114, through service air inlet 117. It is prefered to adjust pivot handle 86 so that compressed air pressure is in the range of approximately 40 psi to 100 psi and is maintained while push rod 118 travel is measured. Compressed air pressure supplied to the service pneumatic system in this method simulates depression of the tractor brake pedal. As shown in FIG. 11 push rod 118 extends from air brake chamber 114 while reference point 123 is designated by a vertical line. In FIG. 11, measuring the distance from point 123 along push rod 118 to air brake chamber 114 will provide the distance push rod 118 has traveled. The distance of this travel can be compared to known maximum push rod travel distances to determine if calibration and/or adjustments of slack adjusters 119 are required. Use of device 150 and this method have many advantages over prior methods in which a tractor is connected to the trailer and compressed air pressure in the service pneumatic system is applied by physically depressing the brake pedal.

Device 150 may be used to diagnose and isolate the source of a pneumatic problem in a tractor-trailer. The source of the problem can quickly and efficiently be determined by disconnecting the pneumatic systems of the trailer from the tractor and hooking up device 150 between the pneumatic systems while leaving the tractor and trailer mechanically joined. With the tractor and trailer mechanically connected as in normal use, the emergency and service output lines from the tractor can be pneumatically joined to pneumatic inlets 215 and 216, respectively. After connecting a compressed air supply to air compressor junction 87, as described above, the emergeny and service input lines of the trailer can be pneumatically joined to pneumatic outlets 77 and 78 respectively. The pneumatic output of the tractor into device 150 and the reaction of the trailer's pneumatic system to the pneumatic output of device 150 can be observed and inspected in order to isolate the source of a pneumatic problem as being in the pneumatic system of the trailer or the pneumatic system of the tractor, or in the combined systems of the tractor-trailer.

Likewise, device 150 may be used to diagnose and isolate the source of an electrical problem of a tractor-trailer. Battery power is supplied to device 150 as described above by connecting a battery to connections 243 and 242 so that electrical current can be transmitted to the trailer's lights. While leaving the tractor and trailer mechanically attached the electrical output line of the tractor is disconnected from the trailer and connected with electrical inlet 250, and the trailer's electric input line is connected to electrical outlet 260. The electrical output of the tractor can be tested by observing housing lights 220–225 which are directly energized by the tractor's output through electrical inlet connection 250. The electrical system of the trailer is tested as described above by using switches 235–240 to illuminate the safety lights of the trailer with electrical power supplied by battery connections 243 and 242. This method of inserting device 150 between the electrical system of the tractor and trailer provides an improved means for isolating the source of electrical problems which are often difficult to diagnose due to multiple shorts, crossed wires, and other wiring problems in the electrical circuits of both the tractor and trailer.

Device 150 can likewise be used to diagnose and isolate the source of a pneumatic or electrical problem in a tandem tractor-trailer system comprising multiple trailers connected together and to the tractor by tow dollies. The source of the problem can quickly and efficiently be determined whether the problem is in the tractor, the first trailer, the second trailer, the third trailer, or the connecting tow dollies. With the trailers and tow dollies connected to the tractor, device 150 is connected to the service pneumatic systems, emergency pneumatic systems, and electrical systems of the trailer or tow dollies as described above. Device 150 can be utilized to check the inputs and outputs on the front and back of tandem trailers.

As further seen in FIG. 6–8, when pivot switch 84 is off, second pneumatic release valve 90 will exhaust itself. Pivot switch 84 can exhaust compressed air through exhaust hose 105. Pivot switch 84 is off when it is positioned up as in FIG. 8. Pivot switch 84 is fully on when it is positioned down as in FIG. 6 which preferrably provides a pressure of 120 psi. Pivot switch 84 is partially on, and provides a pressure between 0 psi and 120 psi when it is positioned as in FIG. 9. When switch 82 is off first pneumatic release valve 88 and relay valve 89 will exhaust. Switch 82 exhausts compressed air through exhaust hose 104.

The illustrations and examples provided herein are for explanatory purposes and are not intended to limit the scope of the appended claims.

I claim:

1. A device to test tractor-trailer electrical and pneumatic systems comprising:
   (a) a housing;
   (b) first and second pneumatic inlets, each inlet for connection to the tractor pneumatic output lines, said first and second pneumatic inlets attached to said housing;
   (c) first and second pneumatic gauges, said first and second pneumatic gauges attached to said housing and to said first and second pneumatic inlets;
   (d) an air compressor junction, said air compressor junction attached to said housing for joining an air compressor to said device; and
   (e) a first pneumatic outlet, said first pneumatic outlet attached to said housing and in fluid communication with said air compressor junction, said first pneumatic outlet for connection to the pneumatic input line of the pneumatic system of the trailer.

2. The device of claim 1 and including an electrical circuit, said electrical circuit contained within said housing, and an electrical inlet, said inlet affixed to said housing and connected to said electrical circuitry whereby said tractor's electric output line can be connected to said electrical circuitry through said inlet.

3. The device of claim 2 and including an electric outlet, said outlet attached to said housing and joined to said electrical circuitry whereby a trailer's electric input line can be connected to said electric outlet to test the trailer's electrical system.

4. The device of claim 3 and including a circuit breaker, said circuit breaker joined to said electrical circuitry and said electric outlet.

5. The device of claim 1 and including:
   (a) a pneumatic regulator, said regulator in fluid communication with said air compressor junction;
   (b) a pneumatic switch, said pneumatic switch attached to said housing and in fluid communication with said regulator;
   (c) a first pneumatic quick release valve, said first quick release valve in fluid communication with said pneumatic switch; and
   (d) a pneumatic relay valve, said relay valve in fluid communication with said regulator, said first quick release valve, and said first pneumatic outlet, whereby compressed air is transmitted through said relay valve and said first pneumatic outlet for testing a trailer's pneumatic systems connected to said pneumatic outlet.

6. The device of claim 5 and including:

(a) a second pneumatic quick release valve, said second pneumatic quick release valve in fluid communication with said relay valve; and
   (b) a second pneumatic outlet, said second pneumatic outlet attached to said housing and in fluid communication with said second pneumatic release valve whereby air is conveyed through said device to test a trailer's pneumatic systems connected with said first and second pneumatic outlets.

7. The device of claim 1 wherein said first pneumatic inlet includes a pneumatic check valve.

8. The device of claim 3 wherein said electrical circuitry includes a flasher circuit.

9. A method of testing electrical circuitry of a tractor-trailer, said tractor having an electrical output line connected to the tractor's electrical circuitry, said trailer having an electrical input line connected to the trailer's electrical circuitry using testing apparatus having electrical circuitry comprising a tractor inlet and a trailer outlet, the method comprising the steps of:
   (a) connecting said tractor's electrical output line to said testing apparatus' tractor inlet;
   (b) connecting said trailer's electrical input line to said testing apparatus' trailer outlet;
   (c) testing said tractor's electrical output by activating the tractor's electrical circuitry; and
   (d) testing said trailer's electrical circuitry by activating said apparatus' electrical circuitry.

10. The method of claim 9 including the step of isolating the source of an electrical problem contained within the electrical circuitry of said tractor-trailer.

11. The method of claim 9 wherein said tractor's electrical circuitry comprises a plurality of switches and said testing apparatus' electrical circuitry comprises a plurality of visual indicators, the method including the step of activating said tractor's switches and observing said apparatus' visual indicators.

12. The method of claim 9 wherein said trailer's electrical circuitry comprises a plurality of lights and said testing apparatus' electrical circuitry comprises a plurality of switches, the method including the step of activating said apparatus' switches and observing said trailer's lights.

13. The method of claim 12 wherein said testing apparatus' electrical circuitry comprises a flasher circuit, the method including the step of activating said apparatus' flasher circuit and observing said trailer's flashing lights.

14. A method of testing pneumatic systems of a tractor-trailer, said tractor having an emergency pneumatic output line and a service pneumatic output line connected to the tractor's pneumatic system, said trailer having an emergency pneumatic input line and a service pneumatic input line connected to the trailer's pneumatic system by using testing apparatus having pneumatic circuitry comprising an emergency pneumatic tractor inlet and a service pneumatic tractor inlet and an emergency pneumatic trailer outlet, and a service pneumatic trailer outlet, the method comprising the steps of:
   (a) connecting said tractor's emergency and service pneumatic output lines respectively to said testing apparatus' emergency and service pneumatic tractor inlets;
   (b) connecting said trailer's emergency and service pneumatic input lines respectively to said testing apparatus' emergency and service pneumatic trailer outlets;
   (c) testing said tractor's emergency and service pneumatic outputs by activating the tractor's pneumatic system; and (d) testing said trailer's emergency and service pneumatic system by activating said apparatus' pneumatic circuitry.

15. The method of claim 14 wherein said testing apparatus' pneumatic circuitry comprises an air compressor junction, the method including the step of connecting an air compressor to said air compressor junction.

16. The method of claim 14 wherein said testing apparatus' emergency pneumatic tractor inlet comprises a pneumatic check valve, and wherein the step of testing said tractor's emergency pneumatic output includes the step of opening said check valve to simulate a rupture in said tractor's emergency pneumatic output line.

17. The method of claim 14 wherein said tractor's pneumatic system comprises a brake pedal, and wherein testing said tractor's pneumatic outputs includes the step of depressing said brake pedal with an adjustable elongated member.

18. The method of claim 15 wherein said trailer's pneumatic system comprises an air brake chamber, said air brake chamber having a push rod and wherein testing said trailer's emergency and service pneumatic system includes the step of:

(a) withdrawing said push rod by activating said apparatus' pneumatic circuitry;

(b) marking a point on said push rod adjacent said air brake chamber;

(c) extending said push rod by activating said apparatus' pneumatic circuitry; and (d) measuring the distance from said marked point along said push rod to said air brake chamber.

19. The method of claim 18 wherein the step of marking a point on said push rod includes the step of spray painting said push rod adjacent said air brake chamber.

* * * * *